United States Patent
Yamada

(10) Patent No.: US 10,745,603 B2
(45) Date of Patent: Aug. 18, 2020

(54) THERMOSOFTENING AND HEAT CONDUCTIVE SILICONE GREASE COMPOSITION, HEAT CONDUCTIVE FILM FORMATION METHOD, HEAT DISSIPATION STRUCTURE, AND POWER MODULE DEVICE

(71) Applicant: SHIN-ETSU CHEMICAL CO., LTD., Tokyo (JP)

(72) Inventor: Kunihiro Yamada, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 15/763,004

(22) PCT Filed: Sep. 12, 2016

(86) PCT No.: PCT/JP2016/076766
§ 371 (c)(1),
(2) Date: Mar. 23, 2018

(87) PCT Pub. No.: WO2017/051738
PCT Pub. Date: Mar. 30, 2017

(65) Prior Publication Data
US 2018/0291249 A1 Oct. 11, 2018

(30) Foreign Application Priority Data

Sep. 25, 2015 (JP) ................. 2015-187688

(51) Int. Cl.
*C08L 83/04* (2006.01)
*C09K 5/06* (2006.01)
(Continued)

(52) U.S. Cl.
CPC ............... *C09K 5/063* (2013.01); *C08K 3/00* (2013.01); *C08K 5/01* (2013.01); *C08L 83/04* (2013.01);
(Continued)

(58) Field of Classification Search
None
See application file for complete search history.

(56) References Cited

U.S. PATENT DOCUMENTS

| | | | |
|---|---|---|---|
| 4,803,100 A | 2/1989 | Ameen et al. | |
| 6,169,142 B1 * | 1/2001 | Nakano ................... | C08K 3/22 524/437 |

(Continued)

FOREIGN PATENT DOCUMENTS

| | | |
|---|---|---|
| CN | 101624514 A | 1/2010 |
| JP | 1-115985 A | 5/1989 |

(Continued)

OTHER PUBLICATIONS

Extended European Search Report dated Apr. 2, 2019, in European Patent Application No. 16848526.6.
(Continued)

*Primary Examiner* — Courtney L Smith
(74) *Attorney, Agent, or Firm* — Birch, Stewart, Kolasch & Birch, LLP

(57) ABSTRACT

A thermosoftening and heat conductive silicone grease composition including: (A) a silicone wax having a melting point of 30-80° C.; (B) a organopolysiloxane indicated by formula $R^1_a SiO_{(4-a)/2}$ ($R^1$ indicating a monovalent hydrocarbon group and a being 1.8≤a≤2.2) and having a kinematic viscosity of 10-500,000 mm²/s at 25° C.; and (C) a heat conductive filler material having a heat conductivity of at least 10 W/(m·K).

7 Claims, 1 Drawing Sheet

(51) Int. Cl.

| | | |
|---|---|---|
| *H01L 23/373* | (2006.01) | |
| *C08K 3/00* | (2018.01) | |
| *C08L 91/06* | (2006.01) | |
| *C08K 5/01* | (2006.01) | |
| *C09K 5/14* | (2006.01) | |
| *H05K 7/20* | (2006.01) | |
| *H01L 23/36* | (2006.01) | |
| *C08L 83/06* | (2006.01) | |
| *C08L 83/08* | (2006.01) | |

(52) U.S. Cl.
CPC .............. *C08L 83/06* (2013.01); *C08L 83/08* (2013.01); *C08L 91/06* (2013.01); *C09K 5/14* (2013.01); *H01L 23/36* (2013.01); *H01L 23/373* (2013.01); *H05K 7/20* (2013.01); *H05K 7/2039* (2013.01); *C08L 2203/20* (2013.01); *C08L 2205/025* (2013.01); *C08L 2205/03* (2013.01); *H01L 2224/32225* (2013.01)

(56) References Cited

U.S. PATENT DOCUMENTS

| | | | | |
|---|---|---|---|---|
| 6,372,337 | B2* | 4/2002 | Takahashi | ............ C10M 169/00 |
| | | | | 428/328 |
| 6,555,905 | B2* | 4/2003 | Yamada | ................... C08K 3/08 |
| | | | | 257/712 |
| 6,896,824 | B2 | 5/2005 | Tomaru et al. | |
| RE41,576 | E | 8/2010 | Bunyan et al. | |
| 8,802,763 | B2* | 8/2014 | Yamada | ............... C09D 183/04 |
| | | | | 524/438 |
| 10,428,257 | B2* | 10/2019 | Liu | ......................... C09K 5/14 |
| 2003/0113556 | A1 | 6/2003 | Feng et al. | |
| 2003/0207128 | A1 | 11/2003 | Uchiya et al. | |
| 2004/0161571 | A1 | 8/2004 | Duvall et al. | |
| 2005/0110133 | A1* | 5/2005 | Yamada | ................... C08K 3/08 |
| | | | | 257/712 |
| 2007/0042533 | A1 | 2/2007 | Endo et al. | |
| 2010/0006798 | A1 | 1/2010 | Endo | |
| 2011/0272119 | A1 | 11/2011 | Bhagwagar et al. | |
| 2014/0135408 | A1* | 5/2014 | Wang | ..................... C07F 9/091 |
| | | | | 514/772.4 |
| 2015/0357261 | A1* | 12/2015 | Tsuji | ...................... C08K 3/08 |
| | | | | 257/712 |
| 2018/0208816 | A1* | 7/2018 | Yamazaki | ................ C09J 11/00 |

FOREIGN PATENT DOCUMENTS

| | | |
|---|---|---|
| JP | 2000-509209 A | 7/2000 |
| JP | 2000-327917 A | 11/2000 |
| JP | 2000-336279 A | 12/2000 |
| JP | 2001-89756 A | 10/2001 |
| JP | 2001-291807 A | 10/2001 |
| JP | 2002-121332 A | 4/2002 |
| JP | 2002-234952 A | 8/2002 |
| JP | 2007-51227 A | 3/2007 |
| JP | 2012-520923 A | 9/2012 |

OTHER PUBLICATIONS

International Search Report issued in PCT/JP2016/076766 (PCT/ISA/210), dated Dec. 13, 2016.
Written Opinion of the International Searching Authority issued in PCT/JP2016/076766 (PCT/ISA/237), dated Dec. 13, 2016.
Chinese Office Action dated Jan. 3, 2020 for Chinese Office Action CN201680055400.X.

* cited by examiner

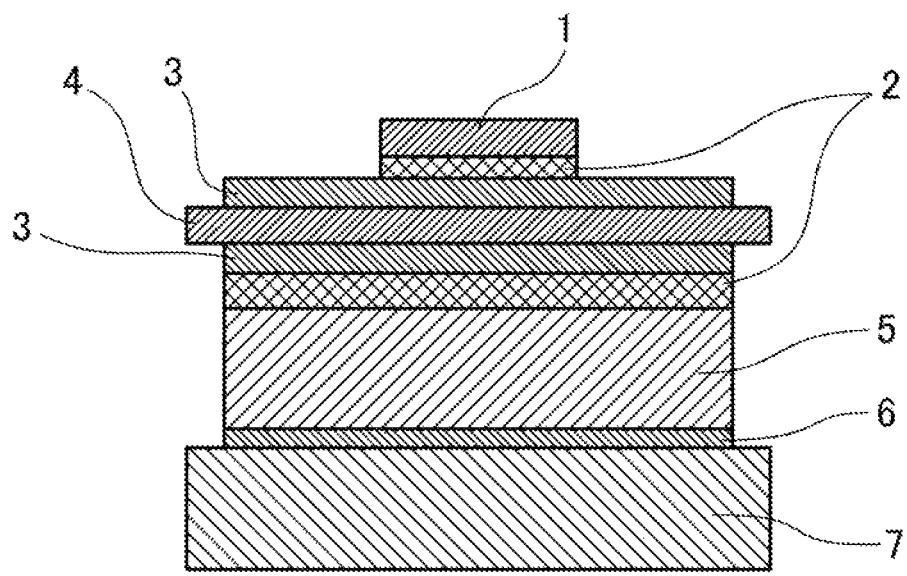

THERMOSOFTENING AND HEAT CONDUCTIVE SILICONE GREASE COMPOSITION, HEAT CONDUCTIVE FILM FORMATION METHOD, HEAT DISSIPATION STRUCTURE, AND POWER MODULE DEVICE

TECHNICAL FIELD

The present invention relates to a heat transfer material which is set at a thermal interface between a heat-generating electronic component and a heat-dissipating component such as a heat sink or a metal housing for the purpose of cooling the electronic component. More particularly, the invention relates to a thermosoftening and heat-conductive silicone grease composition which is based on a silicone resin and decreases in viscosity, softens or melts at a temperature within the working temperature range of the electronic component, increasing adherence to the thermal interface and improving heat transfer from the heat-generating electronic component to the heat-dissipating component, to a method of forming a heat-conductive film thereof, to a heat-dissipating structure, and to a power module device that uses such a composition.

BACKGROUND ART

The circuit designs of the latest electronic equipment, such as TV sets, video equipment, computers, medical appliances, office equipment and communications devices, are becoming increasingly complicated, with integrated circuits containing the equivalent of several hundreds of thousands of transistors now being produced. The trend in electronic equipment toward smaller sizes and higher functionality is accompanied by an increase in the number of electronic components incorporated into the ever-shrinking footprint. At the same time, miniaturization continues also in the shapes of the electronic components themselves. As a result, the heat generated by each electronic component increases. Such heat can lead to failure or malfunction; hence the importance of packaging technology that effectively dissipates heat.

As the level of integration has increased in CPUs, driver ICs, memories and other electronic components used in electronic equipment such as personal computers, DVD players and cell phones, numerous methods for dissipating heat and heat-dissipating members adapted for use therewith have been described in order to remove the heat that is generated.

One approach hitherto taken to hold down the temperature rise by electronic components in electronic equipment has been to conduct heat directly to a heat sink using a metal having a high thermal conductivity such as aluminum, copper or brass. This heat sink carries away heat generated by an electronic component and discharges the heat from a surface by utilizing the temperature difference with outside air. To efficiently conduct heat generated by an electronic component to a heat sink, it is necessary for the heat sink and the electronic component to be placed in close contact without an intervening gap. To this end, a low-hardness heat-conductive sheet having flexibility or a heat-conductive grease is placed between the electronic component and the heat sink.

Yet, although a low-hardness heat-conductive sheet has an excellent handleability, achieving a small thickness is difficult. In addition, because it is unable to conform to minute irregularities in the surfaces of the electronic component and heat sink, the contact thermal resistance is large, as a result of which such a sheet cannot efficiently conduct heat.

By contrast, with heat-conductive greases, the ability to achieve a small thickness makes it possible to reduce the distance between the electronic component and the heat sink. Moreover, such greases bury minute surface irregularities, enabling the thermal resistance to be greatly reduced. However, a drawback of heat-conductive greases is that, with thermal cycling, the thermal properties of the grease decline due to separation of the oil component (pump-out).

In recent years, many thermosoftening materials that are solid at room temperature and soften or melt due to heat generated by electronic components have been described as heat-conductive members which are endowed with both the good handleability of a low-hardness heat-conductive sheet and the thermal resistance-lowering effect of a heat-conductive grease, and additionally provide the advantage of a better pump-out resistance than conventional thermal greases (Patent Documents 1 to 7: JP-A 2000-509209, JP-A 2000-336279, JP-A 2001-89756, JP-A 2002-121332, JP-A 2000-327917, JP-A 2001-291807, JP-A 2002-234952).

However, because thermosoftening materials in which the base oil is based on an organic substance (Patent Documents 1 to 4) have an inferior heat resistance, when such heat-conductive members are incorporated into automotive applications, for example, there is a concern over deterioration at elevated temperatures. Many similar thermosoftening materials that are based on silicones have also been described as materials endowed with good heat resistance, weatherability and flame retardance (Patent Documents 5 to 7), but these are all sheet-type materials.

In cases where the heat-dissipating material is rapidly arranged over a large surface area, air pockets inevitably form between a sheet-type material and the surface with which it comes into contact. Moreover, from the standpoint of the work involved during such arrangement of the heat-dissipating material, the most rapid and efficient method is to apply a heat-dissipating material in paste form by a technique such as screen printing. Sheet-type materials leave something to be desired from this standpoint as well.

PRIOR ART DOCUMENTS

Patent Documents

Patent Document 1: JP-A 2000-509209
Patent Document 2: JP-A 2000-336279
Patent Document 3: JP-A 2001-89756
Patent Document 4: JP-A 2002-121332
Patent Document 5: JP-A 2000-327917
Patent Document 6: JP-A 2001-291807
Patent Document 7: JP-A 2002-234952

SUMMARY OF INVENTION

Technical Problem

It is therefore an object of this invention to provide a thermosoftening and heat-conductive silicone grease composition which can be used as a heat transfer material that is set at a thermal interface between a heat-generating electronic component and a heat-dissipating component such as a heat sink or a metal housing for the purpose of cooling the electronic component, which can be applied in the form of a paste by screen printing or the like, which decreases in viscosity, softens or melts at a temperature within the working temperature range of the electronic component, adhering to the thermal interface, and which has a better pump-out resistance, heat resistance and flame retardance than conventional products. Further objects of the invention are to provide a method of forming a heat-conductive film of the composition, to provide a heat-dissipating structure, and to provide a power module device that uses the composition.

Solution to Problem

The inventors have conducted extensive investigations in order to achieve these objects. As a result, they have discovered that a thermosoftening and heat-conductive silicone grease composition which includes specific amounts of (A) a silicone wax having a melting point of from 30 to 80° C., (B) an organopolysiloxane of general formula (1) having a kinematic viscosity at 25° C. of from 10 to 500,000 mm²/s and (C) a heat-conductive filler having a thermal conductivity of at least 10 W/(m·K), and also preferably (D) a volatile solvent capable of dissolving or dispersing components (A) and (B) and having a boiling point of from 80 to 360° C., because it is in the form of a paste at the time of application, can be easily and rapidly screen-printed and thus does not lower the working efficiency. Moreover, with subsequent evaporation of the solvent included, the composition enters into a non-fluid state at normal temperature, the pump-out resistance rises relative to that of conventional thermal greases, as a result of which the reliability increases.

Here, "thermosoftening" means that the composition softens, decreases in viscosity or melts when subjected to heat (generally, at 30° C. or above). A substance which thermosoftens, decreases in viscosity or melts so that the surface fluidizes may be regarded as "thermosoftening."

Accordingly, the invention provides the following thermosoftening and heat-conductive silicone grease composition, method of forming a heat-conductive film, heat-dissipating structure, and power module device.

[1] A thermosoftening and heat-conductive silicone grease composition comprising:
(A) 100 parts by weight of a silicone wax having a melting point of from 30 to 80° C.;
(B) 10 to 300 parts by weight of an organopolysiloxane which is represented by general formula (1) below $$R^1_a SiO_{(4-a)/2} \quad (1)$$

(wherein $R^1$ is one, two or more groups selected from the group consisting of substituted or unsubstituted monovalent hydrocarbon groups of 1 to 18 carbon atoms; and the subscript a satisfies the condition 1.8≤a≤2.2) and has a kinematic viscosity at 25° C. of from 10 to 500,000 mm²/s; and
(C) 500 to 7,000 parts by weight of a heat-conductive filler having a thermal conductivity of at least 10 W/(m·K).

[2] The thermosoftening and heat-conductive silicone grease composition of [1], wherein the organopolysiloxane of component (B) is an alkyl-modified siloxane of general formula (2) below

[Chem. 1]

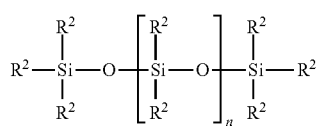

(2)

(wherein each $R^2$ is independently an alkyl group of 1 to 18 carbon atoms, with at least one $R^2$ bonded to a silicon atom on the main chain being an alkyl group of 8 to 18 carbon atoms; and the subscript n is a number such that the organopolysiloxane has a kinematic viscosity at 25° C. of from 10 to 500,000 mm²/s).

[3] The thermosoftening and heat-conductive silicone grease composition of [1] or [2], further comprising, per 100 parts by weight of component (A): (D) 10 to 300 parts by weight of a volatile solvent which can dissolve or disperse component (A) and component (B) and which has a boiling point of from 80 to 360° C.

[4] The thermosoftening and heat-conductive silicone grease composition of [3], wherein component (D) is isoparaffin.

[5] A method of forming a heat-conductive film, comprising the steps of screen-printing the thermosoftening and heat-conductive silicone grease composition of any of [1] to [4] onto a heat-generating electronic component and/or a heat-dissipating component, and subsequently air-drying or heating the applied composition so as to obtain a film that is in a non-fluid state at room temperature.

[6] A heat-dissipating structure comprising a heat-generating electronic component which generates heat upon operation and reaches a temperature that is higher than room temperature, a heat-dissipating component and, disposed between both of these components, a heat-conductive film obtained from the thermosoftening and heat-conductive silicone grease composition of any of [1] to [4], wherein the thermosoftening and heat-conductive silicone grease composition is non-fluid in a room-temperature state prior to operation of the electronic component and, due to heat generation during operation of the electron component, decreases in viscosity, softens or melts such that at least a surface thereof fluidizes, completely filling between the electronic component and the heat-dissipating component.

[7] A power module device comprising a power module and a heat sink provided on a surface of the power module, wherein the thermosoftening and heat-conductive silicone grease composition of any of [1] to [4] is disposed to a thickness of from 25 to 100 μm between the power module surface and the heat sink.

Advantageous Effects of Invention

The thermosoftening and heat-conductive silicone grease composition of the invention is useful as a heat-dissipating material. Following evaporation of the solvent, it is disposed between a heat-generating electronic component and a heat-dissipating component, is not fluid at temperatures prior to operation of the electronic component and, at a temperature of from 30 to 80° C. owing to heat generation during operation of the electronic component, decreases in viscosity, softens or melts, thereby substantially filling the boundary between the electronic component and the heat-dissipating component. Moreover, it has a better pump-out resistance, heat resistance and flame retardance than conventional products.

BRIEF DESCRIPTION OF DRAWINGS

FIG. 1 is a schematic cross-sectional view of a power module device that uses the thermosoftening and heat-conductive silicone grease composition of the invention.

DESCRIPTION OF EMBODIMENTS

The invention is described in detail below.

Component (A):

The silicone wax serving as component (A) is an ingredient associated with the thermosoftening nature of the thermosoftening and heat-conductive silicone grease composition of the invention.

When the melting point of component (A) is less than 30° C., at room temperature, this ingredient does not assume a non-fluid state and has a poor pump-out resistance. When the melting point is higher than 80° C., the composition does not decrease in viscosity, soften or melt due to heat generation during operation of the heat-generating electronic component, and so is unable to perform as intended. The melting point is therefore in the range of 30 to 80° C., and preferably in the range of 35 to 65° C. In this specification, "room temperature" refers to a temperature that is at least 1° C. and below 30° C.

The silicone wax serving as component (A) may be any silicone wax, provided that it is one which is silicone-modified and has a melting point of from 30 to 80° C. However, one obtained by a hydrosilylation reaction between an α-olefin and a SiH bond-containing silicone compound, a dehydration reaction between a higher fatty acid and an amino group-containing silicone compound, or a dehydrogenation reaction between a higher fatty acid and a SiH bond-containing silicone compound is preferred.

A hydrosilylation reaction between an α-olefin and a SiH bond-containing silicone compound is carried out by a known method, either within a solvent or in the absence of a solvent, and using a platinum catalyst. The reaction temperature is preferably from 30 to 150° C., and especially in the range of 60 to 120° C.

Here, the alkyl group bonded to the terminal vinyl group on the α-olefin is preferably one having from 15 to 45 carbon atoms, and especially from 16 to 35 carbon atoms. These alkyl groups are preferably linear, although they may be branched. α-Olefins in a plurality of types may be mixed together.

An organohydrogenpolysiloxane may be used as the SiH bond-containing silicone compound. Such an organohydrogenpolysiloxanes is exemplified by dimethylpolysiloxanes capped at both ends of the molecular chain with dimethylhydrogensiloxy groups, dimethylsiloxane/methylhydrogensiloxane copolymers capped at both ends of the molecular chain with trimethylsiloxy groups, dimethylsiloxane/methylhydrogensiloxane copolymers capped at both ends of the molecular chain with dimethylhydrogensiloxy groups, organosiloxane copolymers consisting of siloxane units of the formula $(CH_3)_3SiO_{1/2}$, siloxane units of the formula $(CH_3)_2HSiO_{1/2}$ and siloxane units of the formula $SiO_{4/2}$, and mixtures of two or more thereof.

The reaction of an α-olefin with a SiH bond-containing silicone compound is typically carried out with amounts thereof such that the number of hydrogen atoms bonded to silicon atoms on the SiH bond-containing silicone compound per vinyl group on the α-olefin is from 0.7 to 1.5, but is not limited thereto.

The dehydration reaction of a higher fatty acid with an amino group-containing silicone compound also can be easily carried out under known conditions. An amino group-containing silicone compound and a higher fatty acid are mixed together in a solvent, reacted at a temperature of from 80 to 150° C. under solvent refluxing and the water of condensation is removed by distillation, following which the solvent is typically removed under reduced pressure.

Here, a compound of general formula (3) below may be used as the amino group-containing silicone compound.

$$A_xR^3_ySiO_{(4-x-y)/2} \quad (3)$$

$R^3$ in formula (3) is a monovalent hydrocarbon group of 1 to 20 carbon atoms, examples of which include alkyl groups such as methyl, ethyl, propyl, octyl and lauryl groups, alkenyl groups such as vinyl and allyl groups, aryl groups such as phenyl, tolyl and naphthyl groups, cycloalkyl groups such as cyclopentyl and cyclohexyl groups, and any these groups in which some or all hydrogen atoms are substituted with halogen atoms; a hydroxyl group; or a group of the formula —OR' (wherein R' is a monovalent hydrocarbon group of 1 to 20 carbon atoms). R' can be exemplified in the same way as the monovalent hydrocarbon group of 1 to 20 carbon atoms represented by $R^3$ above.

Also, A is an aminoalkyl group of the formula —$R^4$(NR$^5$R$^6$)$_z$NR$^7$R$^8$ where $R^4$ and $R^6$ are each divalent hydrocarbon groups of 1 to 6 carbon atoms, examples of which include alkylene groups such as methylene, ethylene, propylene and hexamethylene groups, and also the phenylene group; $R^5$, $R^7$ and $R^8$ are each hydrogen atoms or monovalent hydrocarbon groups of 1 to 20 carbon atoms similar to those of $R^3$ above; and the subscript z is an integer from 0 to 5. Examples of such aminoalkyl groups include, but are not limited to, —$C_3H_6NH_2$, —$C_3H_6NHC_2H_4NH_2$, —$C_6H_{12}NHC_2H_4NH_2$, —$C_3H_6(NHC_2H_4)_2NH_2$, —$C_3H_6(NHC_2H_4)_3NH_2$, —$C_2H_4NHC_2H_4NH_2$ and —$CH_2NHC_2H_4N(C_4H_9)_2$.

The subscripts x and y satisfy the conditions $0<x\leq3$, $0\leq y<3$, and $0<x+y\leq3$.

The amino group-containing silicone compound of formula (3) is generally one in which the end of the silicone chain is capped with a trimethylsilyl group, although use may optionally be made of one in which the end is capped with, for example, a hydroxyl group or an alkoxy group.

Examples of the higher fatty acid used include palmitic acid, stearic acid, arachidic acid, behenic acid and lignoceric acid, although stearic acid is preferred in terms of, for example, availability. The amount of higher fatty acid charged, in terms of the molar ratio with respect to the amount of amino groups with which it can react, is preferably at least equimolar.

The dehydrogenation reaction of a higher fatty acid with a SiH bond-containing silicone compound also can be carried out under known conditions. The higher fatty acid is dissolved or dispersed in a solvent and azeotropic dehydration is carried out at a temperature of from 80 to 150° C., following which the system is cooled, a platinum catalyst is added and, under refluxing once again at a temperature of 80 to 150° C., the SiH bond-containing silicone compound is added dropwise and the dehydrogenation reaction is carried out under a stream of nitrogen gas. Following aging, the solvent is typically removed under reduced pressure.

Here, an organohydrogenpolysiloxane may be used as the SiH bond-containing silicone compound. Examples of such organohydrogenpolysiloxanes include dimethylpolysiloxanes capped at both ends of the molecular chain with dimethylhydrogensiloxy groups, dimethylsiloxane/methylhydrogensiloxane copolymers capped at both ends of the molecular chain with trimethylsiloxy groups, dimethylsiloxane/methylhydrogensiloxane copolymers capped at both ends of the molecular chain with dimethylhydrogensiloxy groups, organosiloxane copolymers consisting of siloxane units of the formula $(CH_3)_3SiO_{1/2}$, siloxane units of the formula $(CH_3)_2HSiO_{1/2}$ and siloxane units of the formula $SiO_{4/2}$, and mixtures of two or more thereof.

Examples of the higher fatty acid used include palmitic acid, stearic acid, arachidic acid, behenic acid and lignoceric acid, although stearic acid is preferred in terms of, for example, availability. The amount of higher fatty acid charged, in terms of the molar ratio with respect to the amount of SiH groups with which it can react, is preferably at least equimolar.

Component (B):

Following application of the thermosoftening and heat-conducting silicone grease composition of the invention by screen printing or the like onto a heat-generating electronic component and/or a heat-dissipating component, in cases where the composition includes component (D), by air-drying or heating and thereby evaporating off the volatile solvent serving as component (D), the composition assumes a non-fluid state at room temperature. Subsequently, due to heat generation during operation of the electronic component, the composition decreases in viscosity, softens or melts, with at least the surface thereof fluidizing. Component (B) is an ingredient required to increase such fluidity.

The organopolysiloxane of component (B) is one having general formula (1) below and a kinematic viscosity at 25° C. of from 10 to 500,000 mm²/s.

$$R^1_a SiO_{(4-a)/2} \quad (1)$$

Here, $R^1$ is one, two or more groups selected from the group consisting of substituted or unsubstituted monovalent hydrocarbon groups of 1 to 18 carbon atoms; and the subscript a satisfies the condition $1.8 \leq a \leq 2.2$.

In above formula (1), $R^1$ is one, two or more groups selected from the group consisting of substituted or unsubstituted, saturated or unsaturated monovalent hydrocarbon groups of 1 to 18 carbon atoms. Examples of such groups include alkyl groups such as methyl, ethyl, propyl, hexyl, octyl, decyl, dodecyl, tetradecyl, hexadecyl and octadecyl groups; cycloalkyl groups such as cyclopentyl and cyclohexyl groups; alkenyl groups such as vinyl and allyl groups; aryl groups such as phenyl and tolyl groups; aralkyl groups such as 2-phenylethyl and 2-methyl-2-phenylethyl groups; and halogenated hydrocarbon groups such as 3,3,3-trifluoropropyl, 2-(perfluorobutyl)ethyl, 2-(perfluorooctyl)ethyl and p-chlorophenyl groups. The subscript a is preferably in the range of 1.8 to 2.2, and especially the range of 1.9 to 2.1.

When the organopolysiloxane used in this invention has a kinematic viscosity at 25° C. that is lower than 10 mm²/s, oil bleed tends to occur; when the kinematic viscosity is higher than 500,000 mm²/s, the fluidity when the composition decreases in viscosity, softens or melts is poor. Hence, the kinematic viscosity at 25° C. must be from 10 to 500,000 mm²/s, and is preferably from 30 to 10,000 mm²/s. Here and below, the kinematic viscosity of the organopolysiloxane is the value measured at 25° C. with an Ostwald viscometer.

The organopolysiloxane serving as component (B) is most preferably an alkyl-modified siloxane of general formula (2) below.

[Chem. 2]

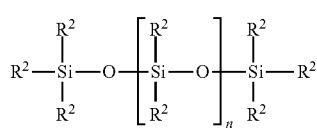

(2)

In this formula, each $R^2$ is independently an alkyl group of 1 to 18 carbon atoms, with at least one $R^2$ bonded to a silicon atom on the main chain being an alkyl group of 8 to 18 carbon atoms. The subscript n is a number such that the organopolysiloxane has a kinematic viscosity at 25° C. of from 10 to 500,000 mm²/s.

In above formula (2), each $R^2$ is independently an alkyl group of 1 to 18 carbon atoms such as a methyl, ethyl, propyl, hexyl, octyl, decyl, dodecyl, tetradecyl, hexadecyl or octadecyl group. At least one $R^2$ bonded to a silicon atom on the main chain is an alkyl group of 8 to 18 carbon atoms, and preferably 10 to 14 carbon atoms. This alkyl group may be branched.

The subscript n is a number such that the organopolysiloxane has a kinematic viscosity at 25° C. of from 10 to 500,000 mm²/s, preferably from 30 to 10,000 mm²/s, and more preferably from 100 to 8,000 mm²/s.

When the amount of component (B) included per 100 parts by weight of component (A) is less than 10 parts by weight, the fluidity following decrease in viscosity, softening or melting is poor; when the amount is more than 300 parts by weight, following the evaporation of component (D), the composition does not assume a non-fluid state at room temperature and instead enters into a state like that of a conventional thermal grease. Therefore, the amount of component (B) included is in the range of 10 to 300 parts by weight, and preferably in the range of 50 to 250 parts by weight.

Component (C):

It is essential that the heat-conductive filler serving as component (C) have a thermal conductivity of at least 10 W/(m·K). At a thermal conductivity below 10 W/(m·K), the thermal conductivity of the thermosoftening and heat-conductive silicone grease composition itself becomes lower. The upper limit in the thermal conductivity varies also with the material used as the heat-conductive filler, and so there is no particular upper limit.

Examples of heat-conductive fillers having a thermal conductivity of 10 W/(m·K) or more include powders or granular substances such as aluminum powder, copper powder, silver powder, nickel powder, gold powder, alumina powder, zinc oxide powder, magnesium oxide powder, aluminum nitride powder, boron nitride powder, silicon nitride powder, diamond powder and carbon powder. The filler may be of one type used alone or two or more may be mixed and used together.

In cases where a powder or granular substance is used as the heat-conductive filler, the particles thereof may be of an amorphous shape, a spherical shape or of any shape, although it is desirable to use a filler having an average particle size of from 0.1 to 100 µm, preferably from 0.5 to 50 µm, and more preferably from 0.5 to 30 µm. When the average particle size is less than 0.1 µm, the composition does not become grease-like and has a poor extensibility; on the other hand, when the average particle size exceeds 100 µm, the composition has a poor uniformity. The average particle size is the volume-base cumulative average size measured with the Microtrac MT-3300EX particle size analyzer from Nikkiso Co., Ltd.

The amount of the above heat-conductive filler included per 100 parts by weight of component (A) is in the range of 500 to 7,000 parts by weight, preferably in the range of 1,000 to 6,000 parts by weight, and more preferably from 2,000 to 5,000 parts by weight. When the amount included is less than 500 parts by weight, the required thermal conductivity is not obtained; when the amount included is more than 7,000 parts by weight, the composition does not become grease-like and has a poor extensibility.

Component (D):

In addition, a volatile solvent is preferably included as component (D) in the thermosoftening and heat-conductive silicone grease composition of the invention. The volatile solvent serving as component (D) may be any solvent capable of dissolving or dispersing component (A) and component (B). Examples include toluene, xylene, acetone, methyl ethyl ketone, cyclohexane, n-hexane, n-heptane, butanol, IPA and isoparaffin. From the standpoint of safety, health concerns and ease of operation in printing, an isoparaffin-based solvent is preferred.

The volatile solvent serving as component (D) is one having a boiling point of from 80 to 360° C., and preferably from 150 to 350° C. At a boiling point below 80° C., evaporation is too rapid and the viscosity during the printing operation rises, which may lead to undesirable effects. At a boiling point in excess of 360° C., the solvent will tend to remain in the thermosoftening and heat-conductive silicone grease composition of the invention and the thermal properties may decrease.

In cases where component (D) is included, when the amount of addition is less than 10 parts by weight per 100 parts by weight of component (A), the viscosity at room temperature of the thermosoftening and heat-conductive silicone grease composition of the invention cannot be sufficiently lowered, as a result of which the printability may also worsen. When the amount of addition is more than 300 parts by weight, precipitation of the filler speeds up and the shelf life of the thermosoftening and heat-conductive silicone grease composition may worsen. Therefore, the amount of addition is preferably in the range of 10 to 300 parts by weight, and more preferably in the range of 50 to 200 parts by weight.

In addition, in some cases, component (E) and/or component (F) below may also be used in this invention.

Component (E):

Component (E) is a hydrolyzable organopolysiloxane of general formula (4) that is trifunctional at one end.

[Chem. 3]

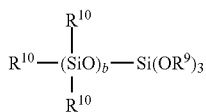

(4)

In this formula, $R^9$ is an alkyl group of 1 to 6 carbon atoms, $R^{10}$ is one, two or more groups selected from the group consisting of substituted or unsubstituted monovalent hydrocarbon groups of 1 to 18 carbon atoms, and the subscript b is an integer from 5 to 120.

The organopolysiloxane of general formula (4) is used for treating the surface of the heat-conductive filler serving as component (C). Not only does it help achieve a high loading of the heat-conductive filler, by covering the surface of the heat-conductive filler, it also discourages the agglomeration of the heat-conductive filler. Moreover, because these effects persist even at elevated temperatures, it functions to increase the heat resistance of this thermosoftening and heat-conductive silicone grease composition.

In formula (4) above, $R^9$ is exemplified by alkyl groups of 1 to 6 carbon atoms, such as methyl, ethyl and propyl groups. Methyl and ethyl groups are especially preferred.

$R^{10}$ is one, two or more groups selected from the group consisting of substituted or unsubstituted, saturated or unsaturated monovalent hydrocarbon groups of 1 to 18 carbon atoms. Examples of such groups include alkyl groups such as methyl, ethyl, propyl, hexyl, octyl, decyl, dodecyl, tetradecyl, hexadecyl and octadecyl groups; cycloalkyl groups such as cyclopentyl and cyclohexyl groups; alkenyl groups such as vinyl and allyl groups; aryl groups such as phenyl and tolyl groups; aralkyl groups such as 2-phenylethyl and 2-methyl-2-phenylethyl groups; and halogenated hydrocarbon groups such as 3,3,3-trifluoropropyl, 2-(perfluorobutyl)ethyl, 2-(perfluorooctyl)ethyl and p-chlorophenyl groups. A methyl group is especially preferred.

The subscript b is an integer from 5 to 120, and preferably an integer from 10 to 90.

The amount of component (E) included per 100 parts by weight of component (A) is preferably from 10 to 200 parts by weight, and more preferably in the range of 30 to 150 parts by weight.

Component (F):

Component (F) is an organosilane of general formula (5) below or a partial hydrolytic condensation product thereof.

 (5)

In this formula, $R^{11}$ is an unsubstituted or halogen atom-substituted monovalent hydrocarbon group of 1 to 20 carbon atoms, W is a hydroxyl group or a hydrolyzable group, and the subscript c is an integer from 1 to 3.

The organosilane of general formula (5) or partial hydrolytic condensation product thereof functions in the same way as component (E) and is used for treating the surface of the heat-conductive filler serving as component (C). Similarly, it not only helps achieve a high loading of the heat-conductive filler, by covering the surface of the heat-conductive filler, it discourages the agglomeration of the heat-conductive filler. Moreover, because these effects persist even at elevated temperatures, it functions to increase the heat resistance of this thermosoftening and heat-conductive silicone grease composition.

In formula (5) above, $R^{11}$ is an unsubstituted or halogen atom-substituted monovalent hydrocarbon group of 1 to 20 carbon atoms. $R^{11}$ is exemplified by alkyl groups, cycloalkyl groups and alkenyl groups. Specific examples include alkyl groups such as methyl, ethyl, propyl, hexyl, octyl, decyl, dodecyl, tetradecyl, hexadecyl and octadecyl groups; cycloalkyl groups such as cyclopentyl and cyclohexyl groups; alkenyl groups such as vinyl and allyl groups; aryl groups such as phenyl and tolyl groups; aralkyl groups such as 2-phenylethyl and 2-methyl-2-phenylethyl groups; and halogenated hydrocarbon groups such as 3,3,3-trifluoropropyl, 2-(perfluorobutyl)ethyl, 2-(perfluorooctyl)ethyl and p-chlorophenyl groups. The subscript c is 1, 2 or 3, with 1 being especially preferred.

W is a hydrolyzable group selected from among alkoxy, acyloxy and alkenyloxy groups of 1 to 6 carbon atoms. Specific examples of the hydrolyzable group include methoxy, ethoxy, propoxy, butoxy, acetoxy and propenoxy groups. Of these, hydroxyl groups and alkoxy groups are especially preferred in the invention.

When an organosilane of general formula (5) or a partial hydrolytic condensation product thereof is included as component (F), the amount of addition thereof per 100 parts by weight of component (A) is preferably in the range of 1 to 50 parts by weight, and more preferably in the range of 10 to 30 parts by weight.

The thermosoftening and heat-conductive silicone grease composition of the invention is prepared by mixing together the various above ingredients for a period of 30 minutes to 4 hours using a mixing apparatus such as the Trimix, Twinmix or Planetary Mixer (all registered trademarks for mixers manufactured by Inoue Mfg. Inc.), the Ultra Mixer (a registered trademark for a mixer manufactured by Mizuho Industrial Co., Ltd.), or the HIVIS DISPER MIX (a registered trademark for a mixer manufactured by Tokushu Kika Kogyo K.K.). If necessary, heating may be carried out.

When the thermal conductivity of the resulting thermosoftening and heat-conductive silicone grease composition is lower than 0.7 W/(m·K), a sufficient heat-dissipating effect may not be obtained. Therefore, the thermal conductivity is preferably at least 0.7 W/(m·K), and more preferably at least 1.0 W/(m·K). The thermal conductivity is a value measured at 25° C. with the TPA-501 from Kyoto Electronics Manufacturing Co., Ltd.

When the viscosity at 25° C. of the thermosoftening and heat-conductive silicone grease composition is lower than 50 Pa·s, the heat-conductive filler serving as component (C) may precipitate more readily; when the viscosity is higher than 500 Pa·s, the ease of application may worsen. Therefore, the viscosity is preferably in the range of 50 to 500 Pa·s, and more preferably from 50 to 300 Pa·s. The viscosity of the thermosoftening and heat-conductive silicone grease composition is the value measured using the PC-1TL spiral viscometer (at 10 rpm) from Malcolm Co., Ltd.

The thermosoftening and heat-conductive silicone grease composition of the invention is applied by screen printing or the like onto a heat-generating electronic component and/or a heat-dissipating component, following which it is air-dried or heated. In cases where a volatile solvent is included as component (D), this component (D) is evaporated off, thereby forming a heat-conductive film that is in a non-fluid state at room temperature.

This invention also provides a heat-dissipating structure which includes a heat-generating electronic component that generates heat when operated, reaching a temperature higher than room temperature, a heat-dissipating component and, disposed between both of these components, a heat-conductive film obtained from a thermosoftening and heat-conductive silicone grease composition. The thermosoftening and heat-conductive silicone grease composition is non-fluid in the room-temperature state prior to operation of the electronic component, and it decreases in viscosity, softens or melts owing to heat generation during operation of the electronic component, so that at least the surface thereof fluidizes, thereby substantially completely filling between the electronic component and the heat-dissipating component.

Power Module Device:

The thermosoftening and heat-conductive silicone grease composition of the invention can be used in a power module device. Such a power module device is a device having a power module and a heat sink provided on a surface of the power module. The thermosoftening and heat-conductive silicone grease composition of the invention is disposed to a thickness of from 25 to 100 μm between the power module surface and the heat sink.

Here, "power module" is a generic term for such devices as thyristor modules, diode modules, IGBT modules and power MOSFETs. A typical structure is shown in FIG. 1, but the power module is not limited to this. The features shown in FIG. 1 are an IGBT chip 1, solder 2, a copper pattern 3, a substrate 4, a copper base plate 5, thermal grease 6 and a heat sink 7. The thermosoftening and heat-conductive silicone grease composition of the invention is used as the thermal grease 6 in FIG. 1.

EXAMPLES

The invention is illustrated more fully below by way of Synthesis Examples, Working Examples and Comparative Examples, although the invention is not limited by these Examples. Specific Examples are shown for the purpose of more clearly demonstrating the superiority of the invention.

Tests relating to the invention were carried out as follows.

The absolute viscosity of the thermosoftening and heat-conductive silicone grease composition was measured with the model PC-1TL viscometer (at 10 rpm) from Malcolm Co., Ltd., and the thermal conductivity was measured with the TPA-501 from Kyoto Electronics Manufacturing Co., Ltd. Both were measured at 25° C. The average particle size is the volume-base cumulative average size measured with the Microtrac MT-3300EX particle size analyzer from Nikkiso Co., Ltd. Determination of the pump-out resistance was carried out by the method shown below.

[Pump-Out Resistance]

First, 0.3 of a thermosoftening and heat-conductive silicone grease composition was applied onto an aluminum plate, following which the solvent within the composition was evaporated off for one hour in a 70° C. oven. Next, prior to cooling, a 0.5 mm spacer was placed on the coated aluminum plate, which was then covered with a slide glass, thereby sandwiching the thermosoftening and heat-conductive silicone grease composition. This test specimen was made to stand upright to the ground, placed within a thermal shock tester from Espec Corporation (model TSE-11-A) that was set so as to repeatedly cycle between 0° C. and 100° C. (every 30 minutes), and a 1,000-cycle test was carried out. After 1,000 cycles, the degree to which the thermosoftening and heat-conductive silicone grease composition had slumped from its original location was measured.

Working Examples 1 to 5 and Comparative Examples 1 to 3

The ingredient amounts shown in Tables 1 and 2 were charged into a 5-liter Planetary Mixer (a registered trademark for a mixer manufactured by Inoue Mfg. Inc.) and agitated for one hour at 25° C., thereby preparing thermosoftening and heat-conductive silicone grease compositions in Working Examples 1 to 5 and Comparative Examples 1 to 3. The properties of the resulting thermosoftening and heat-conductive silicone grease compositions are shown in Tables 1 and 2.

TABLE 1

| | Ingredients | | Working Example 1 | Working Example 2 | Working Example 3 | Working Example 4 | Working Example 5 |
|---|---|---|---|---|---|---|---|
| Formulation (g) | (A) | (A-1) | 100 | | | | |
| | | (A-2) | | 100 | | 100 | 100 |
| | | (A-3) | | | 100 | | |
| | (B) | (B-1) | 160 | 160 | 160 | 200 | 50 |
| | (C) | (C-1) | 2,400 | 2,400 | 2,400 | | |
| | | (C-2) | 600 | 600 | 600 | 1,000 | 500 |
| | | (C-3) | | | | 4,000 | 2,000 |

TABLE 1-continued

| Ingredients | | Working Example 1 | Working Example 2 | Working Example 3 | Working Example 4 | Working Example 5 |
|---|---|---|---|---|---|---|
| (D) | (D-1) | 130 | 130 | | 200 | |
| | (D-2) | | | 130 | | 50 |
| (E) | (E-1) | | | | | 100 |
| (F) | (F-1) | | | | 20 | |
| Absolute viscosity (Pa · s) | | 130 | 120 | 150 | 220 | 270 |
| Thermal conductivity (W/(m · K)) (following solvent evaporation) | | 2.8 | 2.7 | 2.9 | 4.5 | 3.5 |
| Pump-out resistance (mm) | | 1 | 1 | 1 | 1 | 2 |

TABLE 2

| Ingredients | | Comparative Example 1 | Comparative Example 2 | Comparative Example 3 |
|---|---|---|---|---|
| Formulation (g) (A) | (A-1) | | | |
| | (A-2) | 100 | 100 | 100 |
| | (A-3) | | | |
| (B) | (B-1) | 5 | 320 | 160 |
| (C) | (C-1) | 2,400 | 2,400 | 6,400 |
| | (C-2) | 600 | 600 | 1,600 |
| | (C-3) | | | |
| (D) | (D-1) | 130 | 130 | 130 |
| | (D-2) | | | |
| (E) | (E-1) | | | |
| (F) | (F-1) | | | |
| Absolute viscosity (Pa · s) | | 500 | 90 | did not become grease-like |
| Thermal conductivity (W/(m · K)) (following solvent evaporation) | | 4.7 | 1.7 | — |
| Pump-out resistance (mm) | | following solvent evaporation, was too hard and did not crush down to spacer thickness of 0.5 mm (lacked fluidity) | 12 | — |

Component (A) Silicone Wax
(A-1) Silicone Wax (I)

Synthesis Example 1

A flask was charged with 924 g (2.2 moles) of α-olefins having an average structural formula of $C_{30}H_{60}$, the same amount of toluene and 5 g of a neutralized tetramethyldivinyldisiloxane complex of chloroplatinic acid (0.5 wt % toluene solution), following which 726 g (1.0 mole) of a SiH bond-containing silicone compound of the average structural formula shown below was added dropwise at 80° C. The reaction was then carried out for 5 hours under toluene refluxing at 110 to 120° C., following which the toluene was stripped, thereby giving 2,310 g of Silicone Wax (I). At this time, the number of hydrogen atoms bonded to silicon atoms on the SiH bond-containing silicone compound per vinyl group on the α-olefin was 1.1 atoms.

The melting point of this Silicone Wax (I) was 61° C. The Silicone Wax (I) obtained in Synthesis Example 1 was used as component (A-1).

[Chem. 4]

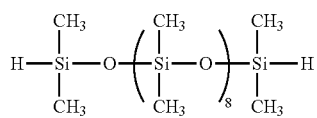

(A-2) Silicone Wax (II)

Synthesis Example 2

A flask was charged with 1,860 g of an amino group-containing silicone compound having the average structural formula shown below, the same amount of toluene and 205 g of stearic acid, the temperature was then raised under a stream of nitrogen gas and, while carrying out the reaction for 10 hours at 110 to 120° C. under refluxing, the water of condensation was distilled off. The toluene was then stripped off, thereby giving 1,858 g of Silicone Wax (II). The stearic acid/amino group-containing silicone compound charging ratio at this time, expressed as a molar ratio, was 2.2.

The melting point of this Silicone Wax (II) was 40° C. The Silicone Wax (II) obtained in Synthesis Example 2 was used as component (A-2).

[Chem. 5]

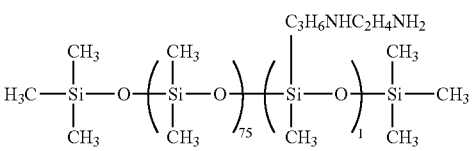

(A-3) Silicone Wax (III)

Synthesis Example 3

A flask was charged with 350 g of stearic acid and 360 g of toluene, following which one hour of azeotropic dehydration was carried out under a stream of nitrogen gas and toluene refluxing at 110 to 120° C., and the system was cooled down to 70° C. Next, the flask was charged with 2 g of a neutralized tetramethyldivinyldisiloxane complex of chloroplatinic acid (0.5 wt % toluene solution), following which the temperature was again raised and a dehydrogenation reaction was carried out for 8 hours under toluene refluxing at 110 to 120° C. and while adding dropwise 100 g of a SiH bond-containing silicone compound of the average structural formula shown below. Two hours of aging was then carried out, and Silicone Wax (III) was obtained by similarly stripping off the toluene. At this time, the stearic acid/SiH group-containing silicone compound charging ratio, expressed as a molar ratio, was 1.1.

The melting point of this Silicone Wax (III) was 45° C. The Silicone Wax (III) obtained in Synthesis Example 3 was used as component (A-3).

[Chem. 6]

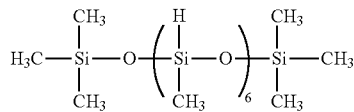

Component (B) Organopolysiloxane
(B-1) Polysiloxane of formula (B-1) below

[Chem. 7]

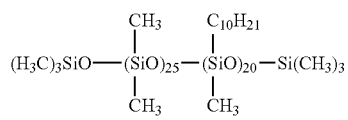

Dynamic viscosity, 390 mm²/s

Component (C) Heat-Conductive Filler
(C-1) Alumina powder: average particle size, 8.9 μm (thermal conductivity, 27 W/(m·K))
(C-2) Zinc oxide powder: average particle size, 1.0 μm (thermal conductivity, 54 W/(m·K))
(C-3) Aluminum powder: average particle size, 20 μm (thermal conductivity, 236 W/(m·K))
Component (D) Volatile Solvent
(D-1) IP Solvent 2028
  (trade name for an isoparaffin-based solvent available from Idemitsu Kosan Co. Ltd.; boiling point, 210-254° C.)
(D-2) IP Solvent 2835
  (trade name for an isoparaffin-based solvent available from Idemitsu Kosan Co., Ltd.; boiling point, 270-350° C.)
Component (E)
(E-1) A polysiloxane of the following formula

[Chem. 8]

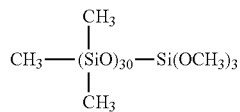

Dynamic viscosity, 35 mm²/s

Component (F)
(F-1) A silane of the following formula

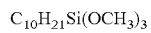

REFERENCE SIGNS LIST

1 IGBT chip
2: Solder
3: Copper pattern
4: Substrate
5: Copper base plate
6: Thermal grease
7: Heat sink

The invention claimed is:

1. A thermosoftening and heat-conductive silicone grease composition comprising:
(A) 100 parts by weight of a silicone wax having a melting point of from 30 to 80° C. and the silicone wax is obtained by:
a hydrosilylation reaction between an α-olefin and a SiH bond-containing silicone compound, or
a dehydration reaction between a higher fatty acid and an amino group containing silicone compound;
(B) 10 to 300 parts by weight of an organopolysiloxane which is represented by general formula (1) below $$R^1_a SiO_{(4-a)/2} \quad (1)$$

(wherein $R^1$ is one, two or more groups selected from the group consisting of substituted or unsubstituted monovalent hydrocarbon groups of 1 to 18 carbon atoms; and the subscript a satisfies the condition $1.8 \leq a \leq 2.2$) and has a kinematic viscosity at 25° C. of from 10 to 10,000 mm²/s; and
(C) 500 to 7,000 parts by weight of a heat-conductive filler having a thermal conductivity of at least 10 W/(m·K).

2. The thermosoftening and heat-conductive silicone grease composition of claim 1, wherein the organopolysiloxane of component (B) is an alkyl-modified siloxane of general formula (2) below
[Chem. 1]

[Chem. 1]

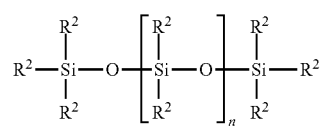

(wherein each $R^2$ is independently an alkyl group of 1 to 18 carbon atoms, with at least one $R^2$ bonded to a silicon atom on the main chain being an alkyl group of 8 to 18 carbon atoms; and the subscript n is a number such that the organopolysiloxane has a kinematic viscosity at 25° C. of from 10 to 500,000 mm²/s).

3. The thermosoftening and heat-conductive silicone grease composition of claim 1, further comprising, per 100 parts by weight of component (A): (D) 10 to 300 parts by weight of a volatile solvent which can dissolve or disperse component (A) and component (B) and which has a boiling point of from 80 to 360° C.

4. The thermosoftening and heat-conductive silicone grease composition of claim 3, wherein component (D) is isoparaffin.

5. A method of forming a heat-conductive film, comprising the steps of screen-printing the thermosoftening and heat-conductive silicone grease composition of claim 1 onto a heat-generating electronic component and/or a heat-dissipating component, and subsequently air-drying or heating the applied composition so as to obtain a film that is in a non-fluid state at room temperature.

6. A heat-dissipating structure comprising a heat-generating electronic component which generates heat upon operation and reaches a temperature that is higher than room temperature, a heat-dissipating component and, disposed between both of these components, a heat-conductive film obtained from the thermosoftening and heat-conductive silicone grease composition of claim 1, wherein the thermosoftening and heat-conductive silicone grease composition is non-fluid in a room-temperature state prior to operation of the electronic component and, due to heat generation during operation of the electron component, decreases in viscosity, softens or melts such that at least a surface thereof fluidizes, completely filling between the electronic component and the heat-dissipating component.

7. A power module device comprising a power module and a heat sink provided on a surface of the power module, wherein the thermosoftening and heat-conductive silicone grease composition of claim 1 is disposed to a thickness of from 25 to 100 μm between the power module surface and the heat sink.

* * * * *